United States Patent
Jambor et al.

(10) Patent No.: US 8,165,322 B2
(45) Date of Patent: Apr. 24, 2012

(54) CIRCUIT FOR PROCESSING SOUND SIGNALS

(75) Inventors: Dirk T. Jambor, Krefeld (DE); Helmut Butz, Messstetten (DE)

(73) Assignee: Gebrüder Frei GmbH & Co. KG, Albstadt-Onstmettingen (DE)

( * ) Notice: Subject to any disclaimer, the term of this patent is extended or adjusted under 35 U.S.C. 154(b) by 983 days.

(21) Appl. No.: 12/122,074

(22) Filed: May 16, 2008

(65) Prior Publication Data
US 2008/0310654 A1    Dec. 18, 2008

(30) Foreign Application Priority Data

May 16, 2007 (DE) .......................... 10 2007 023 061
May 16, 2008 (DE) .......................... 10 2008 023 919

(51) Int. Cl.
*H03G 5/00* (2006.01)
(52) U.S. Cl. ......................................... 381/120; 381/98
(58) Field of Classification Search .................... 381/98, 381/120
See application file for complete search history.

(56) References Cited

U.S. PATENT DOCUMENTS
2004/0179700 A1 * 9/2004 Neumann et al. ............... 381/98

FOREIGN PATENT DOCUMENTS
DE                22 31 647           1/1974
* cited by examiner

*Primary Examiner* — Steven J Fulk
(74) *Attorney, Agent, or Firm* — Henry M. Feiereisen; Ursula B. Day

(57) ABSTRACT

A circuit for processing sound signals includes an input amplifier for amplifying an input signal, wherein the amplified input signal is supplied to an output amplifier unchanged via a primary path configured as a bypass line and processed via one or several secondary paths configured as a circuit for processing the amplified input signal for amplifying and outputting the processed signal, wherein respective signal portions of the amplified input signal, which are supplied to the output amplifier via the primary path and the secondary path(s), can each be adjusted with an adjusting device, and wherein the secondary path includes a corresponding equalizing filter for filtering a corresponding frequency range with a dynamic circuit for optionally dynamically changing frequency, amplitude and phase depending on the signal and concurrent with a static control.

9 Claims, 3 Drawing Sheets

CIRCUIT FOR PROCESSING SOUND SIGNALS

BACKGROUND OF THE INVENTION

The invention relates to a circuit for processing sound signals.

Known circuits for processing sound signals are, for example, multiband compressors. This type of circuit, which is shown in the example of FIG. 4, has a signal processing device 20 arranged between an input amplifier 10 and an output amplifier 30. The signal processing device 20 is constructed of a parallel connection of circuits with filters 22a, 22b, 22c, which pass the amplified input signal received from the output amplifier 10 only in defined frequency ranges and includes dynamic circuits 24a, 24b, 24c which are connected after the filters 22a, 22b, 22c and represent compressors for further compressing the defined frequency range.

As shown in FIG. 4, the filters 22a, 22b, 22c are, for example, a low pass filter 22a, a bandpass filter 22b, and a high pass filter 22c. When using a conventional multiband compressor, the amplified input signal is completely split by the corresponding filters 22a, 22b, 22c, processed separately and then again combined in the output amplifier 30 which includes an adder. Splitting and combining can break up the signal and cause an audible loss in quality of the processed sound signal.

SUMMARY OF THE INVENTION

It is therefore an object of the invention to provide a circuit for processing sound signals which is capable of improving the quality of sound signals.

This object is attained by a circuit recited for processing sound signals with an input amplifier for amplifying an input signal, wherein the amplified input signal is supplied to an output amplifier unchanged via a primary path as a bypass line and processed via one or several secondary paths as a circuit for processing the amplified input signal for amplification and outputting the processed signal, wherein respective signal portions of the amplified input signal which are supplied to the output amplifier via the primary path and the secondary path(s) can each be adjusted with an adjusting device, and wherein the secondary path (20) includes a corresponding equalizing filter for filtering a corresponding frequency range with a dynamic circuit for optionally dynamically changing frequency, amplitude and phase depending on the signal and concurrent with a static control.

A circuit for processing sound signals has an input amplifier for amplifying an input signal, wherein the amplified input signal is processed and supplied unchanged via a primary path implemented as a bypass line and via one or several secondary paths implemented as a circuit for processing the amplified input signal to an output amplifier which amplifies and for outputs the processed signal, wherein corresponding signal portions of the amplified input signal which are supplied to the output amplifier via the primary path and the secondary path(s) can each be adjusted with an adjusting device, and wherein the secondary path includes a corresponding equalizing filter which filters a corresponding frequency range with a dynamic circuit for optionally dynamically changing frequency, amplitude and phase depending on the signal and concurrent with a static control.

The combination of a primary path and secondary paths carrying variable signals with special filters provides a number of processing options for signals.

Preferably, the secondary path includes as a circuit for processing the amplified input signal at least one equalizing filter which passes the amplified input signal in a certain frequency range, with an integrated dynamic circuit for an optionally dynamically changing frequency, amplitude and phase depending on the signal.

By integrating the dynamic circuit with the equalizing filter, or EQ filter, very fine corrections in the sound signal can be attained. In addition, the entire sound characteristics can be processed better and simpler while also improving the quality.

Preferably, the secondary path includes a plurality of equalizing filters with an integrated dynamic circuit representing a circuit for processing the amplified input signal. The plurality of equalizing filters with integrated dynamic circuit can be connected in parallel or in series.

The equalizing filters with the integrated dynamic circuit can be switched on and off as needed.

In comparison with a conventional structure with dynamic filters, where typically only a single filter is employed, the equalizing filter with compressor circuit can be better controlled over the adjustable frequency range.

Preferably, the output amplifier includes an adder which can be used to combine the various elements of the split signal.

The equalizing filters with integrated dynamic circuit are preferably mostly variable RC-filters with different frequency bands and filter characteristics, which are statically and dynamically controlled via a negative feedback path.

The filter characteristics have preferably a Shelving, Bell, Boost and Cut filter.

The circuit of the invention or parts of the circuit can be implemented in hardware. However, the circuit of the invention or parts of the circuit can also be implemented in software.

BRIEF DESCRIPTION OF THE DRAWING

The disclosed and additional features and details of the invention will become clearer to a skilled artisan from the following detailed description and the appended drawings, which illustrate the features of the present invention with reference to an example, and wherein.

DETAILED DESCRIPTION OF PREFERRED EMBODIMENTS

Preferred embodiments of the present invention will now be described in more detail with reference to the appended drawings.

Figure 1:
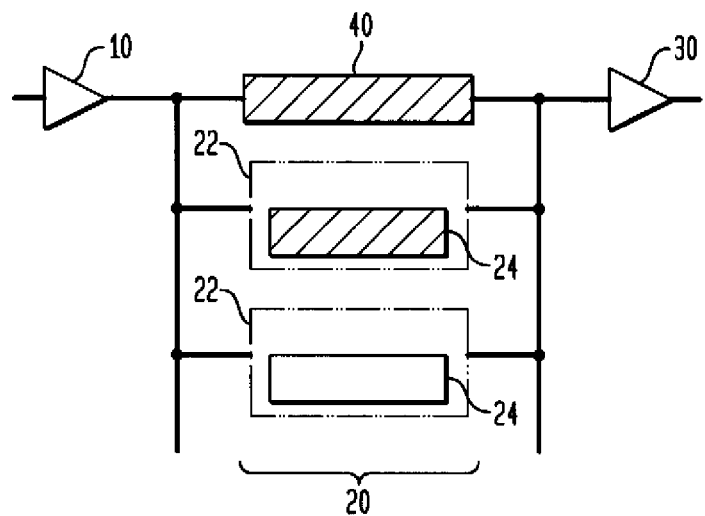
FIG. 1 is a block diagram of an embodiment of the circuit for processing sound signals according to the present invention.
Figure 2:
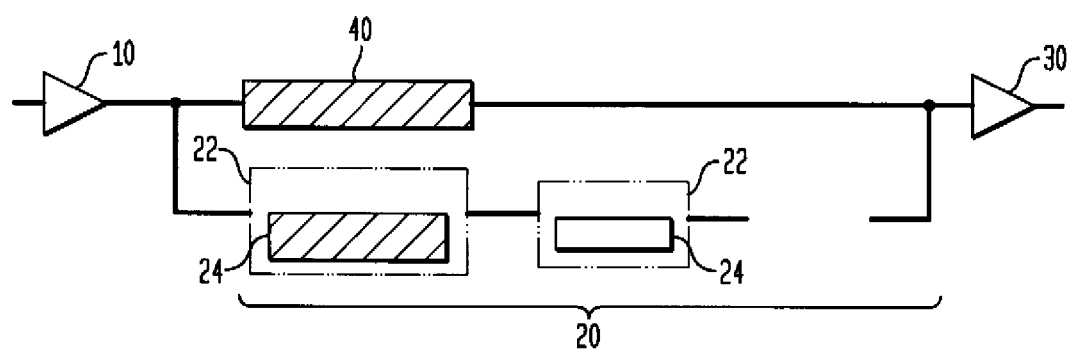
FIG. 2 is a block diagram of another embodiment of the circuit for processing sound signals according to the present invention.

FIGS. 1 and 2 show block diagrams of corresponding embodiments of the circuit for processing sound signals according to the present invention. In accordance with the circuit described above with reference to FIG. 4, the circuit includes a signal processing device as a secondary path 20 between an input amplifiers 10 and output amplifier 30. Preferably, the output amplifier 30 also includes an adder which combines the various signal elements supplied by the signal processing device representing the secondary path 20.

Figure 4:
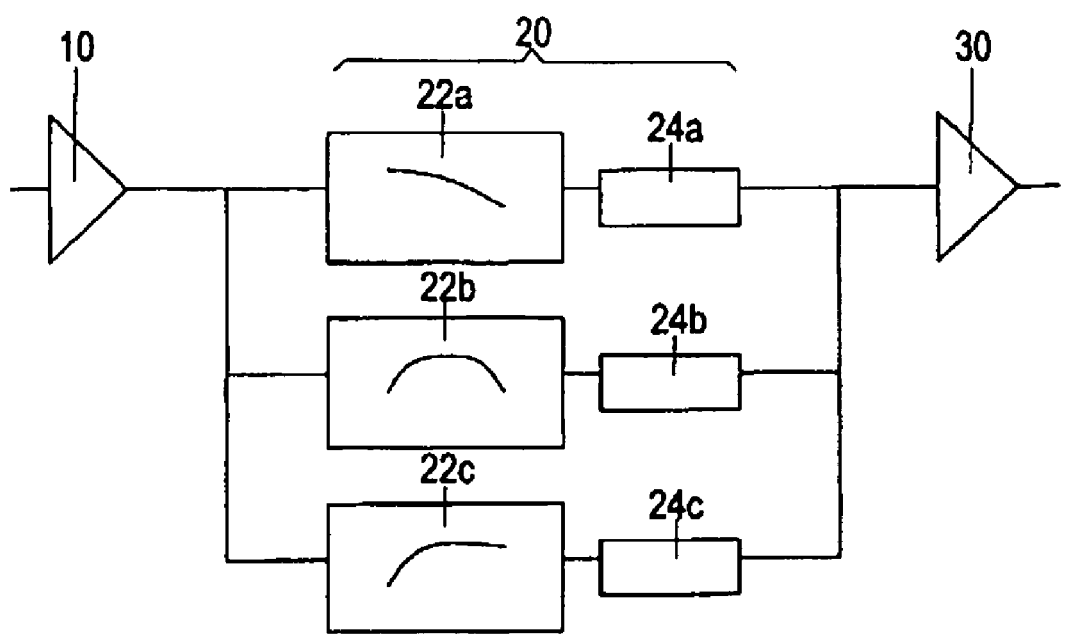
FIG. 4 is a block diagram of a conventional circuit for processing sound signals.

Unlike the circuit shown in FIG. 4, the signal processing device depicted in FIG. 1 is implemented as a secondary path 20 and constructed of circuits with filters 22 which are connected in parallel. The circuits pass the amplified input signal from the input amplifier 10 only in certain frequency ranges, and include dynamic circuits integrated with the filters 22 for additional compression of the corresponding frequency range and/or for dynamically changing frequency, amplitude and phase. Connected in parallel with this parallel connection is a primary path 40 between the input amplifier 10 and output amplifier 30 configured as a bypass line.

Unlike the circuit shown in FIG. 4, the signal processing device depicted in FIG. 2 is constructed as a secondary path 20 of circuits with filters 22 connected in series that pass the amplified input signal from the input amplifier 10 only in certain frequency ranges, and with dynamic circuits integrated with the filters 22 for additional compression of the corresponding frequency range and/or for dynamically changing frequency, amplitude and phase. Connected in parallel with this series connection is a primary path 40 between the input amplifier 10 and output amplifier 30 configured as a bypass line.

By configuring the circuit that processes the amplified input signal as a primary path implemented as a bypass line 40 and connecting the bypass line 40 in parallel with a secondary path implemented as a signal processing device 20, a large portion of the signal can be supplied directly and unprocessed to the output amplifier 30, thus bypassing the circuit 24 which processes the amplified input signal. This approach significantly improves the audible quality of the produced output signal.

By integrating the dynamic circuit with the equalizing filter 22, or EQ filter, as compressor circuit 24, very fine corrections can be made to the sound signal. The entire sound characteristics can be processed in better and simpler form and its quality improved by connecting equalizing filters 22 with integrated dynamic circuits 24 in series or in parallel with each other, which can optionally be switched on or off.

Figure 3:
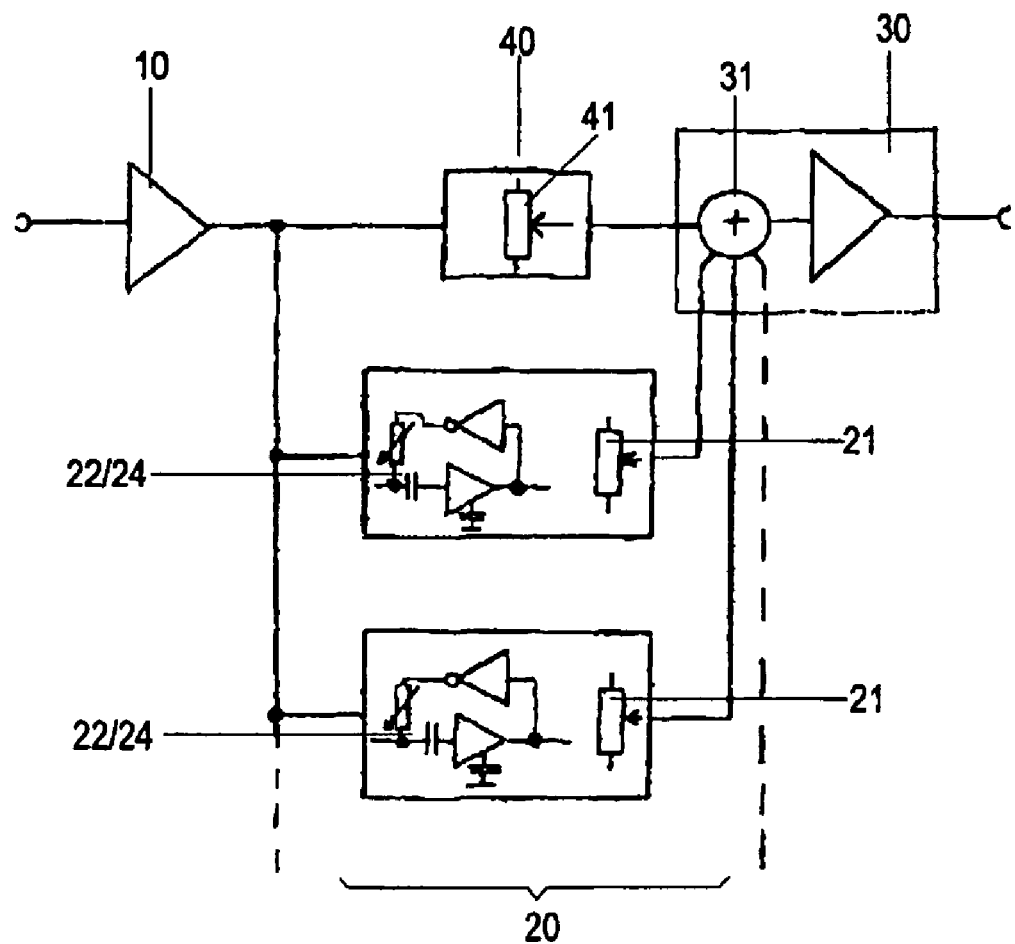
FIG. 3 is a more detailed block diagram of an embodiment of the circuit for processing sound signals according to the present invention.

FIG. 3 shows a block diagram of a particularly preferred embodiment of the circuit for processing sound signals according to the present invention. The circuit for processing sound signals includes an input amplifier 10 for amplifying an input signal, wherein the amplified input signal is supplied, on one hand, unchanged via a primary path 40 configured as a bypass line and, on the other hand, processed via several secondary paths 20 representing a circuit for processing the amplified input signal, to an output amplifier 30 which amplifies and outputs the processed signal. The signal fractions of the amplified input signal, which are supplied via the primary path 40 and the secondary paths 20 to the output amplifier 30, can be adjusted with a corresponding adjusting device 41, 21. The secondary path 20 also includes a corresponding equalizing filter 22 for filtering a corresponding frequency range with the dynamic circuit 24 for optional dynamic changes of frequency, amplitude and phase independent of the signal concurrent with a static control.

Preferably, the output amplifier 30 also includes an adder 31 which combines the various signal elements received from the primary path 40 and the secondary paths 20.

More particularly, the equalizing filters 22 with integrated dynamic circuit 24 are variable RC filters having different frequency bands and filter characteristics, which are statically and dynamically controlled via a negative feedback path. The filter characteristics include a Shelving, Bell, Boost and Cut filter.

The circuit of the invention or parts thereof can be implemented in hardware. However, the circuit of the invention or parts thereof can also be implemented in software.

With the circuit for processing sound signals according to the present invention, an optional dynamic control is performed not after a static control, but simultaneous with the static control by using the same circuit (in the secondary path 20). The filter this can be operated either at a constant frequency, amplitude and phase or the frequency, amplitude and phase can be changed dynamically, depending on the signal.

By combining the primary path and secondary paths carrying variable signals with special dynamic filters, a number of previously unknown processing options can be realized.

With the system, even critical audio material may be carefully improved, repaired, restored to the highest quality, or may alternatively be strongly altered or distorted in a creative way.

The attainable result is different from results obtained with conventional devices, such as equalizers, multiband compressors, etc.

The circuit of the invention for processing sound signals can therefore be used to produce high-quality sound signals.

What is claimed is:

1. A circuit for processing sound signals, comprising:
an input amplifier amplifying an input signal;
an output amplifier;
a primary signal path connected between the input amplifier and the output amplifier and supplying the amplified input signal to the output amplifier unchanged;
a first adjusting device for statically adjusting a first portion of the amplified signal transmitted via the primary signal path;
at least one secondary signal path connected between the input amplifier and the output amplifier and supplying a processed amplified input signal to the output amplifier;
an second adjusting device for statically adjusting a second portion of the amplified signal transmitted via the at least one secondary signal path,
wherein the at least one secondary signal path further comprises an equalizing filter for filtering a corresponding frequency range, the equalizing filter including an integrated dynamic circuit for dynamically changing frequency, amplitude and phase depending on the signal in conjunction with a static control,
wherein the integrated dynamic circuit is configured to be switched on and switched off, and
wherein the equalizing filter with the integrated dynamic circuit is a variable RC-filter having a different frequency bands and filter characteristics, with the variable RC filter being dynamically controlled by a negative feedback path.

2. The circuit of claim 1, wherein the at least one secondary signal path comprises as a circuit for processing the amplified input signal a plurality of equalizing filters which each include an integrated dynamic circuit.

3. The circuit of claim 2, wherein the plurality of equalizing filters are connected in parallel.

4. The circuit of claim 2, wherein the plurality of equalizing filters are connected in series.

5. The circuit of claim 1, wherein the output amplifier comprises an adder which combines signals received from the primary path and the at least one secondary path.

6. The circuit of claim 1, wherein the filter characteristics include a Shelving, Bell, Boost and Cut filter.

7. The circuit of claim 1, wherein the circuit or portions of the circuit is/are implemented in hardware.

8. The circuit of claim 1, wherein the circuit or portions of the circuit is/are implemented in software.

9. The circuit of claim 1, wherein the at least one secondary signal path comprises as a circuit for processing the amplified input signal at least one equalizing filter, through which the amplified input signal passes in a predetermined frequency range, with an integrated dynamic circuit for additional signal-dependent adjustment of filter frequency, filter amplitude and filter phase.

* * * * *